United States Patent
Irisawa et al.

(10) Patent No.: US 11,142,620 B2
(45) Date of Patent: Oct. 12, 2021

(54) PHOTOSENSITIVE RESIN COMPOSITION, ETCHING METHOD AND PLATING METHOD

(71) Applicant: MITSUBISHI PAPER MILLS LIMITED, Tokyo (JP)

(72) Inventors: Munetoshi Irisawa, Tokyo (JP); Kunihito Kajiya, Tokyo (JP); Yuji Toyoda, Tokyo (JP)

(73) Assignee: MITSUBISHI PAPER MILLS LIMITED, Tokyo (JP)

( * ) Notice: Subject to any disclaimer, the term of this patent is extended or adjusted under 35 U.S.C. 154(b) by 122 days.

(21) Appl. No.: 16/489,790

(22) PCT Filed: Mar. 8, 2018

(86) PCT No.: PCT/JP2018/008940
§ 371 (c)(1),
(2) Date: Aug. 29, 2019

(87) PCT Pub. No.: WO2018/164217
PCT Pub. Date: Sep. 13, 2018

(65) Prior Publication Data
US 2020/0012190 A1    Jan. 9, 2020

(30) Foreign Application Priority Data
Mar. 9, 2017 (JP) .............................. JP2017-044446

(51) Int. Cl.
C08J 7/043 (2020.01)
G03F 7/031 (2006.01)
G03F 7/038 (2006.01)
G03F 7/033 (2006.01)
G03F 7/039 (2006.01)
G03F 7/16 (2006.01)
G03F 7/20 (2006.01)
G03F 7/32 (2006.01)
G03F 7/40 (2006.01)

(52) U.S. Cl.
CPC .............. *C08J 7/043* (2020.01); *G03F 7/031* (2013.01); *G03F 7/033* (2013.01); *G03F 7/038* (2013.01); *G03F 7/039* (2013.01); *G03F 7/168* (2013.01); *G03F 7/2004* (2013.01); *G03F 7/322* (2013.01); *G03F 7/40* (2013.01)

(58) Field of Classification Search
CPC .......... G03F 7/031; G03F 7/033; G03F 7/038; G03F 7/027; G03F 7/0382
See application file for complete search history.

(56) References Cited

FOREIGN PATENT DOCUMENTS

| JP | 57-49105 | 3/1982 |
|----|----------|--------|
| JP | 9-265180 | 10/1997 |
| JP | 10-246961 | 9/1998 |
| JP | 2004-341059 | 12/2004 |
| JP | 4002657 B2 * | 11/2007 |
| JP | 2009-20191 | 1/2009 |
| JP | 2010-113349 | 5/2010 |
| JP | 2011-81031 | 4/2011 |
| JP | 2013-37272 | 2/2013 |
| JP | 2014-235391 | 12/2014 |
| JP | 2015132834 A * | 7/2015 |

OTHER PUBLICATIONS

English Machine Translation of Irisawa (JP2015132834A) (Year: 2015).*
International Search Report dated May 29, 2018 in International (PCT) Application No. PCT/JP2018/008940.

* cited by examiner

*Primary Examiner* — John A McPherson
*Assistant Examiner* — Nicholas E Brown
(74) *Attorney, Agent, or Firm* — Wenderoth, Lind & Ponack, L.L.P.

(57) ABSTRACT

A photosensitive resin composition which comprises (A) an alkali-soluble resin, (B) a photopolymerization initiator and (C) an acrylate monomer and may further comprise (D) a methacrylate monomer, wherein the acrylate monomer (C) comprises (C1) an acrylate monomer having a double bond equivalent of not less than 250 and (C2) azo acrylate monomer having a double bond equivalent of not more than 150, the content of the methacrylate monomer (D) is 0 to 5 mass %, the content of the acrylate monomer having a double bond equivalent of not less than 250 (C1) is 40 to 60 mass %, and the content of the acrylate monomer having a double bond equivalent of not more than 150 (C2) is 40 to 60 mass % based on the acrylate monomer (C), and the content of the photopolymerization initiator (B) is 0.5 to 1.5 mass % based on the photosensitive resin composition, and an etching method and plating method using the above photosensitive resin composition.

7 Claims, No Drawings

PHOTOSENSITIVE RESIN COMPOSITION, ETCHING METHOD AND PLATING METHOD

TECHNICAL FIELD

The present invention relates to a photosensitive resin composition and an etching method and plating method using the photosensitive resin composition.

BACKGROUND ART

When metal processing such as the etching of a metal substrate or metal plating is carried out in the manufacture of printed circuit boards, lead frames, metal masks, shadow masks, semiconductor packages, electrode members, electromagnetic shields and precision springs, a resist is used. For example, to etch a metal substrate in the manufacture of metal masks, lead frames and shadow masks, there is an etching method for etching a metal substrate, comprising the steps of forming a photosensitive resin layer containing a photosensitive resin composition on a metal substrate, carrying out pattern exposure to cure exposed parts, performing alkali development to remove the photosensitive resin layer of unexposed parts so as to form a resist pattern containing the cured photosensitive resin layer, and spraying the exposed metal substrate with an etchant.

Conventionally, a photosensitive resin composition prepared by mixing a photocrosslinking reagent such as ammonium dichromate with a water-soluble polymer such as polyvinyl alcohol (PVA), gelatin or casein has been used as an etching resist used when a metal substrate is etched. However, this photosensitive resin composition has a problem that the disposal of a chromium waste liquid is difficult and, therefore, a dry film resist comprising an alkali development type photosensitive resin composition has replaced this photosensitive resin composition in most cases.

However, this dry film resist comprising an alkali development type photosensitive resin composition has problems that it has low adhesion to a metal substrate such as 42 alloy (iron 58-nickel 42 alloy), stainless, titanium copper alloy or copper nickel alloy and the infiltration of an etchant into a space between an etching resist and the surface of a metal substrate occurs, thereby reducing product yield.

To eliminate the infiltration of the etchant, great efforts have been made to improve an alkali-soluble resin, crosslinkable monomer or adhesion accelerator contained in a photosensitive resin composition. For example, the introduction of styrene into the alkali soluble resin and the introduction of a urethane bond into the crosslinkable monomer are such examples. Examples of the adhesion accelerator include heterocyclic derivatives of heterocyclic compounds having a benzotriazole, tetrazole or mercapto group (refer to Patent Document 1).

However, for a photosensitive resin composition which cannot achieve sufficiently high adhesion even when the above improvement has been made, a method in which baking is carried out after a resist pattern containing a photosensitive resin composition cured through exposure and alkali development is formed may be employed. Since the method in which baking is carried out at 100 to 300° C. after the resist pattern is formed improves adhesion between the metal substrate and the resist and significantly suppresses the infiltration of an etchant, it is useful. However, when the etching resist is peeled off after etching, a problem occurs that the resist peeled pieces become large and it takes a long time to peel off the resist. Also, there arises a problem that the resist becomes hard and is easily broken.

Meanwhile, there is proposed a photosensitive resin composition which dissolves in a resist peeling liquid when a resist is peeled off (refer to Patent Documents 2 to 5). When solubility in a resist peeling liquid is high, problems such as a peeling failure and the bending of a metal substrate which occur due to the resist peeled pieces caught by the metal substrate after etching can be solved. In Patent Documents 2 to 5, to enhance the solubility in a resist peeling liquid of a photosensitive resin composition, there is proposed a photosensitive resin composition having a reduced content of a methacrylate monomer and an increased content of an acrylate monomer as crosslinkable monomers. However, when the content of the acrylate monomer is increased, the resist swells at the time of alkali development as the hydrophilicity of the photosensitive resin composition becomes too high, thereby making it difficult to resolve a resist space having a narrow width of not more than 50 μm. Thus, it has been very difficult to produce a photosensitive resin composition which has solubility in a resist peeling liquid and high resolution at the same time.

In a (semi)additive method for printed boards and an additive method for metal masks, a resist pattern is being made fine. Therefore, a photosensitive resin composition having high resolution is desired. In these methods, a photosensitive resin layer containing a photosensitive resin composition is formed on a substrate by using a plating resist, pattern exposure is carried out to cure exposed parts, alkali development is then performed to remove the photosensitive resin layer of unexposed parts so as to form a resist pattern containing the cured photosensitive resin layer, and a metal pattern having a narrow pitch is formed on the exposed substrate by electrolytic plating to form a thick metal layer in narrow resist spaces. However, in the step of peeling off the resist, which is carried out after electrolytic plating, the plating resist is not peeled off properly and the resist peeled pieces remain on the substrate. To solve this problem, a photosensitive resin composition which has solubility in a resist peeling liquid and high resolution at the same time is desired as in the case of etching.

PRIOR ART DOCUMENTS

Patent Documents

Patent Document 1: JP-A 10-246961
Patent Document 2: JP-A 9-265180
Patent Document 3: JP-A 2010-113349
Patent Document 4: JP-A 2011-81031
Patent Document 5: JP-A 2013-37272

DISCLOSURE OF THE INVENTION

Problem to be Solved by the Invention

It is an object of the present invention to provide a photosensitive resin composition which exhibits such high resolution that it can form a fine resist pattern and is excellent in the solubility in a resist peeling liquid of the cured photosensitive resin composition. It is another object of the present invention to provide an etching method and a plating method in which a resist peeling failure hardly occurs though fine processing is possible.

Means For Solving the Problem

According to the present invention, the above objects of the present invention were attained by the following means.

(1) A photosensitive resin composition which comprises (A) an alkali-soluble resin, (B) a photopolymerization initiator and (C) an acrylate monomer and may further comprise (D) a methacrylate monomer, wherein the acrylate monomer (C) comprises (C1) an acrylate monomer having a double bond equivalent of not less than 250 and (C2) an acrylate monomer having a double bond equivalent of not more than 150; the content of the methacrylate monomer (D) is 0 to 5 mass %, the content of the acrylate monomer having a double bond equivalent of not less than 250 (C1) is 40 to 60 mass % and the content of the acrylate monomer having a double bond equivalent of not more than 150 (C2) is 40 to 60 mass % based on the acrylate monomer (C); and the content of the photopolymerization initiator (B) is 0.5 to 1.5 mass % based on the photosensitive resin composition.

(2) The photosensitive resin composition in the above paragraph (1), comprising (E) a benzophenone-based sensitizer, wherein the content of the benzophenone-based sensitizer (E) is 0.20 to 0.40 mass % based on the photosensitive resin composition.

(3) The photosensitive resin composition in the above paragraph (1) or (2), wherein the acrylate monomer having a double bond equivalent of not less than 250 (C1) is polyethylene glycol diacrylate and has a molecular weight of not less than 500.

(4) The photosensitive resin composition in any one of the above paragraphs (1) to (3), wherein the acrylate monomer having a double bond equivalent of not less than 250 (C1) is polyethylene glycol #600 diacrylate.

(5) The photosensitive resin composition in any one of the above paragraphs (1) to (4), wherein the acrylate monomer having a double bond equivalent of not more than 150 (C2) has a hydroxyl group.

(6) The photosensitive resin composition in any one of the above paragraphs (1) to (5), wherein the acrylate monomer having a double bond equivalent of not more than 150 (C2) is pentaerythritol triacrylate.

(7) A method of etching a substrate, comprising the steps of:
  forming a photosensitive resin layer containing the photosensitive resin composition in any one of the above paragraphs (1) to (6) on a substrate;
  carrying out pattern exposure to cure exposed parts;
  performing alkali development to remove the photosensitive resin layer of unexposed parts;
  baking the resist patter after alkali development to form a resist pattern containing the cured photosensitive resin layer; and
  spraying the exposed substrate with an etchant to etch the substrate.

(8) A method of plating a substrate, comprising the steps of:
  forming photosensitive resin layer containing the photosensitive resin composition in any one of the above, paragraphs (1) to (6) on a substrate;
  carrying out pattern exposure to cure exposed parts;
  performing alkali development to remove the photosensitive resin layer of unexposed parts so as to form a resist pattern containing the cured photosensitive resin layer; and
  plating the exposed substrate.

Effect of the Invention

The photosensitive resin composition of the present invention is able to form a fine high-resolution resist pattern and can solve a problem that resist peeled pieces remain after etching or plating as the cured photosensitive resin composition dissolves in a resist peeling liquid.

BEST MODE FOR CARRYING OUT THE INVENTION

A detailed description is subsequently given of the photosensitive resin composition of the present invention. The photosensitive resin composition of the present invention is used as an etching resist or plating resist when metal processing such as the etching of a metal substrate or metal plating is carried out in the manufacture of printed circuit boards, lead frames, metal masks, shadow masks, semiconductor packages, electrode members and electromagnetic shields. It may also be used as an etching resist when the etching of a non-metal substrate such as a rib material, glass or ceramic is carried out. Further, it may also be used as an etching resist for mechanical etching such as sand blasting or wet blasting. It may be further used as a plating resist when plating such as copper plating, nickel plating or gold plating is carried out. Especially when it is used as an etching resist, it is preferably used for high-precision metal processing, example for the manufacture of a high-precision lead frame. When it is used as a plating resist, it is preferably used for the manufacture of a high-precision metal mask.

As the substrate, metal substrates such as copper, copper-based alloys (such as titanium copper alloy and copper nickel alloy), nickel, chromium, iron, tungsten, stainless steel, iron-based alloys such as 42 alloy, aluminum and amorphous alloy may be used. Copper clad laminated sheets, electrolytic (electroless) plated substrates, flexible copper clad laminated sheets, flexible stainless steel sheets and laminates which may be used for the manufacture of printed circuit boards may be used. Non-metal substrates such as glass, ceramics and rib materials may be used. The photosensitive resin composition of the present invention has excellent adhesion especially to metal substrates such as 42 alloy, stainless steel, titanium copper alloy and copper nickel alloy to which a conventional photosensitive resin composition hardly adheres and can be advantageously used for the processing of these metal substrates.

To form a resist pattern, photo method is used. In the photo method, a coating solution containing the photosensitive resin composition is applied to a substrate and dried to form a photosensitive resin layer containing the photosensitive resin composition. A dry film resist (DFR) having the photosensitive resin layer on a carrier film may be produced in advance and the photosensitive resin layer may be transferred to a substrate. Then, pattern exposure is carried out to cure exposed parts. Then, alkali development is performed to remove the photosensitive resin layer of unexposed parts which are not required as a resist pattern so as to form a resist pattern containing the cured photosensitive resin layer.

As an alkali developing solution used for alkali development, for example, an aqueous solution containing an inorganic alkaline compound may be used. Examples of the inorganic alkaline compound include carbonic acid salts and hydroxides of lithium, sodium and potassium. A 0.1 to 3 mass % sodium carbonate aqueous solution may be preferably used. Small amounts of a surfactant, deforming agent and solvent may be mixed with the developing solution. As developing system, dip, battle, spray, blushing and scraping systems may be used, and spray system is most suitable from the viewpoint of removing speed. The treatment temperature with the developing solution is preferably 15 to 35° C., and the spray pressure of the developing solution is preferably 0.02 to 0.3 MPa.

In the present invention, the resist pattern after alkali development may be baked. The effect of improving adhesion between the photosensitive resin layer and the substrate and the effect of improving etchant resistance and plating resistance are obtained by baking. The baking temperature is preferably 80° C. or higher, and the baking time is preferably 5 minutes or more. When the substrate is a material such as copper, which is easily discolored by oxidation, baking is preferably carried out at about 80° C. When the substrate is a material such as stainless steel, which is hardly oxidized, the baking temperature may be 100° C. or higher, and the baking time may be 30 minutes or more. To prevent the thermal deformation of the photosensitive resin layer, active ray irradiation such as ultraviolet irradiation may be carried out before baking.

The etching method, a method for forming a pattern on a substrate by the chemical corrosion function of an etchant. After the resist pattern is formed on the substrate by the photo method, the etchant is sprayed upon the exposed substrate except for the resist pattern to etch the substrate. The photosensitive resin composition of the present invention may be used for non-penetration etching having an etching depth smaller than the thickness of a substrate and also for penetration etching having an etching depth equal to the thickness of a substrate. Any etchant is acceptable if it can dissolve and remove a substrate in use. When the substrate is 42 alloy or copper, a ferric chloride aqueous solution or cupric chloride aqueous solution may be used. The resist pattern is removed in the resist peeling step after the etching step. The resist peeling step is a step for removing the resist pattern from the substrate by spraying a resist peeling liquid or immersing in a resist peeling liquid.

The plating method is a method for forming a metal pattern by plating the exposed substrate except for the resist pattern after the resist pattern is formed on the substrate by the photo method. For example, when a printed circuit board to be manufactured, a substrate having a thin metal layer on an insulating substrate is first prepared as a base material. Then, a resist pattern is formed on parts where a circuit pattern is not to be formed. Then, electrolytic plating is carried out to form a plating metal layer on the surface of the exposed thin metal layer. Subsequently, the resist pattern is removed in the resist peeling step. Thereafter, the thin metal layer is removed by flush etching to form a circuit pattern.

In the resist peeling step, an alkali aqueous solution is advantageously used as the resist peeling liquid. Examples of a basic compound used in the resist peeling liquid include inorganic basic compounds such as alkali silicate metal salts, alkali metal hydroxides, alkali phosphate metal salts, alkali carbonate metal salts, ammonium phosphate and ammonium carbonate; and organic basic compounds such as ethanolamine, ethylene diamine, propane diamine, triethylene tetramine, morpholine and tetramethyl ammonium hydroxide. To control the solubility of the cured photosensitive resin layer in the resist peeling step, the concentration, temperature, spray pressure and ultrasonic wave conditions of the resist peeling liquid must be controlled. As the temperature of the resist peeling liquid becomes higher, the dissolution speed of the cured photosensitive resin layer becomes higher, and a temperature of 40° C. or higher is preferred. As the concentration of the basic compound in the resist peeling liquid, a concentration suitable for solubility is preferred, and when the basic compound is sodium hydroxide, the concentration is preferably 1 to 4 mass %. As the device, a dip treating device, ultrasonic device or shower spray device may be used.

In the present invention, the photosensitive resin layer which has been cured by pattern exposure and baked according to the circumstances is dissolved in the resist peeling liquid when it is removed by the resist peeling liquid. In the present invention, "dissolution" of the cured photosensitive resin layer means that the photosensitive resin layer dissolves in the resist peeling liquid or that the resist peeled pieces become so small that they cannot be visually confirmed. The state that the resist peeled pieces become very small includes from a state that the peeled pieces are dispersed at a molecular level to a state that they are dispersed as particulates having a size of not more than 100 µm.

A description is subsequently given of the photosensitive resin composition of the present invention. The photosensitive resin composition of the present invention comprises (A) an alkali-soluble resin, (B) a photopolymerization initiator and (C) an acrylate monomer, the acrylate monomer (C) contains (C1) 40 to 60 mass % of an acrylate monomer having a double bond equivalent of not less than 250 and (C2) 40 to 60 mass % of an acrylate monomer having a double bond equivalent of not more than 150, and the content of (B) the photopolymerization initiator is 0.5 to 1.5 mass % based on the photosensitive resin composition.

The "alkali-soluble resin (A)" in the present invention refers to a resin having an acid value of 30 to 500 mgKOH/g, Stated more specifically, it is a resin containing an acidic group, and examples of the acidic group include carboxyl group, phenolic hydroxyl group, sulfonate group and phosphate group.

Examples of the alkali-soluble resin (A) include organic polymers such as (meth)acrylic resins, styrene-based resins, epoxy-based resins, amide based resins, amide epoxy-based resins, alkyd-based resins and phenol-based resins. They may be used alone or in combination of two or more. Out of these, (meth)acrylic resins are preferably used. The (meth)acrylic resins should be (meth)acrylic polymers containing (meth)acrylate as the main component obtained by copolymerizing an ethylenically unsaturated carboxylic acid. A monomer having a copolymerizable ethylenically unsaturated group may be copolymerized as well.

Examples of the above (meth)acrylate include methyl (meth)acrylate, ethyl (meth)acrylate, n-propyl (meth)acrylate, isopropyl (meth)acrylate, n-butyl (meth)acrylate, isobutyl (meth)acrylate, n-hexyl (meth)acrylate, 2-ethylhexyl (meth)acrylate, cyclohexyl (meth)acrylate, benzyl (meth)acrylate, 2-hydroxyethyl (meth)acrylate, 2-hydroxypropyl (meth)acrylate, glycidyl (meth)acrylate, lauryl (meth)acrylate, tetrahydrofurfuryl (meth)acrylate, 2-(dimethylamino)ethyl (meth)acrylate, 2-(diethylamino)ethyl (meth)acrylate, 2,2,2-trifluoroethyl (meth)acrylate and 2,2,3,3-tetrafluoropropyl (meth)acrylate.

Examples of the above ethylenically unsaturated carboxylic acid include monocarboxylic acids such as acrylic acid, methacrylic acid and crotonic acid, dicarboxylic acids such as maleic acid, fumaric acid and itaconic acid, and anhydrides and half esters thereof. Out of these, monocarboxylic acids are preferred, and acrylic acid and methacrylic acid are particularly preferred.

Examples of the monomer having a copolymerizable ethylenically unsaturated group include styrene, α-methylstyrene, p-methylstyrene, p-ethylstyrene, p-methoxystyrene, p-ethoxystyrene, p-chlorostyrene, p-bromostyrene, (meth)acrylonitrile, (meth)acrylamide, diacetone acrylamide, vinyl toluene, vinyl acetate and vinyl-n-butyl ether.

The acid value of the alkali-soluble resin (A) affects the alkali development speed, the resist peeling speed, exposure sensitivity, the flexibility of the photosensitive resin layer and adhesion between the photosensitive resin layer and the substrate. The acid value of the alkali-soluble resin (A) is preferably 30 to 500 mgKOH/g, more preferably 100 to 300 mgKOH/g. When the acid value is smaller than 30 mgKOH/g, the alkali developing time tends to become long and when the acid value is larger than 500 mgKOH/g, adhesion between the photosensitive resin layer and the substrate may deteriorate. The acid value is a value measured in accordance with JIS K2501:2003.

The weight average molecular weight of the alkali-soluble resin (A) is preferably 5,000 to 150,000, more preferably 10,000 to 100,000. When the weight average molecular weight of the alkali-soluble resin (A) is lower than 5,000, it may be difficult to form the photosensitive resin composition before curing into a film. When the weight average molecular weight of the alkali-soluble resin (A) is higher than 150,000, solubility in the alkali developing solution tends to deteriorate and the dissolution speed in the resist peeling liquid tends to become low.

Examples of the photopolymerization initiator (B) include aromatic ketones such as 2-benzyl-2-dimethylamino-1-(4-morpholinophenyl)-butan 1-one and 2-methyl-1-[4-(methylthio)phenyl]-2-morpholino-propan-1-one; quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone; benzoin ether compounds such as benzoin methyl ether, benzoin ethyl ether and benzoin phenyl ether; benzoin compounds such as benzoin, methyl benzoin and ethyl benzoin; alkyl phenones such as benzyl dimethyl ketal, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)-benzyl]phenyl}-2-methyl-propan-1-one and 2-(dimethylamino)-2-[(4-methylphenyl)methyl]-1-[4-(4-morpholinyl) phenyl]-1-butanone; acylphosphine oxides such as 2,4,6-trimethylbenzoyl-diphenyl-phosphine oxide and bis(2,4,6-trimethylbenzoyl)-phenylphosphine oxide; oxime esters such as 1,2-octanedione, 1-[4-(phenylthio)phenyl-, 2-(o-benzoyloxime)], ethenone, 1-[9-ethyl-6-(2-methylbenzoyl)-9H-carbazol-3-yl]- and 1-(o-acetyloxime); 2,4,5-triaryl imidazole dimers such as 2-(o-chlorophenyl)-4,5-diphenyl imidazole dimer, 2-(o-chlorophenyl)-4,5-di(methoxyphenyl)imidazole dimer, 2-(o-fluorophenyl)-4,5-diphenyl imidazole dimer, 2-(o-methoxyphenyl)-4,5-diphenyl imidazole dimer and 2-(p-methoxyphenyl)-4,5-diphenyl imidazole dimer; acridine derivatives such as 9-phenylacridine and 1,7-bis(9,9'-acrydinyl)heptane; N-phenyl glycine and N-phenyl glycine derivatives; and coumarin-based compounds. In the above mentioned 2,4,5-triaryl imidazole dimers, corresponding aryl groups, which may be substituted, in the two 2,4,5-triaryl imidazoles may be identical with each other to give a symmetrical compound or may be different from each other to give an asymmetrical compound. Like a combination of diethylthioxanthone and dimethyl aminobenzoic acid, a thioxanthone-based compound and a tertiary amine compound may be used in combination. They may be used alone or in combination of two or more. Out of these, 2,4,5-triaryl imidazole dimers may be advantageously used as they have high sensitivity, and 2-(2'-chlorophenyl)-4,5-diphenyl imidazole dimer is more useful.

The acrylate monomer (C) is a compound having at least one acryloyl group. Examples of the compound having one acryloyl group include methyl acrylate, ethyl acrylate, n-propyl acrylate, isopropylacrylate, n-butyl acrylate, isobutyl acrylate, t-butyl acrylate, n-hexyl acrylate, 2-ethylhexyl acrylate, cyclohexyl acrylate, benzyl acrylate, isomyristyl acrylate, stearyl acrylate, nonylphenoxy polyethylene glycol acrylate (one or more ethoxy groups), 2-hydroxyethyl acrylate, 2-hydroxypropyl acrylate, glycidyl acrylate, lauryl acrylate, tetrahydrofurfuryl acrylate, 2-(dimethylamino)ethyl acrylate, 2-(diethylamino)ethyl acrylate, 2,2,2-trifluoroethyl acrylate, 2,2,3,3-tetrafluoropropyl acrylate, glycerin monoacrylate, methoxy polyethylene glycol acrylate (2 to 30 ethoxy groups) phenoxy polyethylene glycol acrylate (2 to 30 ethoxy groups), methoxy polypropylene glycol acrylate (2 to 30 propoxy groups), phenoxy polypropylene glycol acrylate (2 to 30 propoxy groups), 2-acryloyloxyethyl succinate, 2-hydroxy-3-phenoxypropyl acrylate and ethoxylated o-phenylphenol acrylate.

The compound having two acryloyl groups as the acrylate monomer (C) is a compound obtained by reacting two acrylic acids with a polyhydric alcohol. Examples of the compound include ethylene glycol diacrylate, polyethylene glycol diacrylate (2 to 30 ethoxy groups), propylene glycol diacrylate, polypropylene glycol diacrylate (2 to 30 propoxy groups), polytetramethylene glycol diacrylate, neopentyl glycol diacrylate, 3-methyl-1,5-pentanediol diacrylate, 1,6-hexanediol diacrylate, 1,10-decanediol diacrylate, 1,9-nonanediol diacrylate, dimethylol tricyclodecane diacrylate, diacrylate of ethylene oxide adduct of bisphenol A (2 to 30 ethoxy groups), diacrylate of propylene oxide adduct of bisphenol A (2 to 40 propoxy groups), diacrylates of ethylene oxide and propylene oxide adducts of bisphenol A (sum of ethoxy groups and propoxy groups are 2 to 40), hydroxypivalic acid neopentyl glycol diacrylate, 9,9-bis[4-(2-acryloyloxy ester)phenyl]fluorene and tricyclodecane dimethanol diacrylate.

The compound having three or more acryloyl groups as the acrylate monomer (C) is a compound obtained by reacting an acrylic acid with a polyhydric alcohol. Examples of the compound include trimethylolpropane triacrylate, ditrimethylolpropane tetraacrylate, pentaerythritol triacrylate, pentaerythritol tetraacrylate, dipentaerythritol pentaacrylate, dipentaerythritol hexaacrylate, ethoxylated pentaerythritol triacrylate, trimethylolpropane triglycidyl ether triacrylate, ethoxylated isocyanuric acid triacrylate, caprolactone modified tris-(2-acryloxyethyl) isocyanurate, glycerin triacrylate and ethoxylated glycerin triacrylate. Out of these, pentaerythritol triacrylate can be advantageously used from the viewpoint of the solubility in a resist peeling liquid of the cured photosensitive resin layer.

The benzophenone-based sensitizer (E) is a photosensitizer having a benzophenone structure. It transfers energy obtained by absorbing light to another substance. Examples of the sensitizer include benzophenone, N,N'-tetramethyl-4,4'-diaminobenzophenone (Michler's ketone), N,N'-tetraethyl-4,4'-diaminobenzophenone and 4-methoxy-4'-dimethylaminobenzophenone.

In the photosensitive resin composition of the present invention, the content of the alkali-soluble resin (A) is preferably 40 to 80 mass %, more preferably 45 to 70 mass % based on the photosensitive resin composition. When the content of the alkali-soluble resin (A) is lower than 40 mass %, the tackiness of the photosensitive resin layer becomes high, whereby edge fusion tends to occur when a dry film resist (DFR) having the photosensitive resin layer on a carrier film is produced therefrom and the film tends to wrinkle. When the content of the alkali-soluble resin (A) is higher than 80 mass %, photopolymerizability may deteriorate.

The content of the photopolymerization initiator (B) is preferably 0.5 to 1.5 mass %, more preferably 0.7 to 1.2 mass % based on the photosensitive resin composition. When the content of the photopolymerization initiator (B) is lower than 0.5 mass %, photopolymerizability may become unsatisfactory and when the content is higher than 1.5 mass %, resolution deteriorates.

The content of the acrylate monomer (C) is preferably 20 to 60 mass %, more preferably 30 to 55 mass % based on the photosensitive resin composition. When the content is lower than 20 mass %, photosensitivity is apt to become unsatisfactory and when the content is higher than 60 mass %, the tackiness of the surface of the photosensitive resin layer becomes marked and the photosensitive resin layer after curing tends to become fragile.

The photosensitive resin composition of the present invention may comprise (D) a methacrylate monomer in an amount of not more than 5 mass % based on the acrylate monomer (C).

The methacrylate monomer (D) is a compound obtained by substituting the acryloyl group of the acrylate monomer (C) by a methacryloyl group. In the present invention, the content of the methacrylate monomer (D) is 0 to 5 mass % based on the acrylate monomer (C). When the content of the methacrylate monomer (D) is higher than 5 mass %, the peeled pieces of the cured photosensitive resin layer become large at the time of peeling off the resist and do not dissolve in a resist peeling liquid.

In the present invention, the "double bond equivalent" is defined by (molecular weight of acrylate monomer)/(number of acryloyl groups contained in one molecule of acrylate monomer).

In the photosensitive resin composition of the present invention, the content of the acrylate monomer having a double bond equivalent of not less than 250 (C1) is preferably 40 to 60 mass %, more preferably 45 to 55 mass % based on the acrylate monomer (C). Thereby, the flexibility and adhesion to the substrate of the photosensitive resin layer become high.

Examples of the acrylate monomer having a double bond equivalent of not less than 250 (C1) include methoxy polyethylene glycol acrylate (4 or more ethoxy groups), methoxy polypropylene glycol acrylate (3 or more propoxy groups), ethoxylated o-phenylphenol acrylate, o-phenylphenol glycidyl ether acrylate (3 or more ethoxy groups), isomyristyl acrylate, stearyl acrylate, nonylphenoxy polyethylene glycol acrylate (1 or more ethoxy groups), polyethylene glycol diacrylate (9 or more ethoxy groups), polypropylene glycol diacrylate (7 or more propoxy groups), diacrylate of ethylene oxide adduct of bisphenol A (4 or more ethoxy groups), diacrylate of propylene oxide adduct of bisphenol A (4 or more propoxy groups), polytetramethylene glycol diacrylate (6 or more tetramethylene groups) and ethoxylated pentaerythritol tetraacrylate (15 or more ethoxy groups). Out of these, polyethylene glycol diacrylate (9 or more ethoxy groups) can be advantageously used from the viewpoints of the flexibility and adhesion to the substrate of the photosensitive resin layer.

Out of these, polyethylene glycol diacrylate (9 or more ethoxy groups) having a molecular weight of not less than 500 can be advantageously used and polyethylene glycol #600 diacrylate can be more advantageously used as the acrylate monomer having a double bond equivalent of not less than 250 (C1) from the viewpoints of the flexibility of the photosensitive resin layer and adhesion to the substrate therewith. When polyethylene glycol diacrylate (9 or more ethoxy groups) having a molecular weight of not less than 500 is used, the cross-sectional shape of the resist pattern becomes close to a rectangular shape. When polyethylene glycol #600 diacrylate is used, the cross-sectional shape of the resist pattern becomes closest to a rectangular shape. That is, the top width and the bottom width of the resist pattern become equal to each other. When the resist pattern becomes rectangular, a metal pattern after plating also becomes rectangular, thus obtaining an excellent rectangular metal pattern. Adhesion to the metal becomes high and the infiltration of the etchant from the interface between the substrate and the photosensitive resin layer is suppressed, thereby making possible etching for obtaining a sharp line width.

The photosensitive resin composition of the present invention has a content of the acrylate monomer having a double bond equivalent of not more than 150 (C2) of preferably 40 to 60 mass %, more preferably 45 to 55 mass % based on the acrylate monomer (C). Thereby, the swellability with the alkali developing solution of cured parts lowers and narrow resist spaces can be resolved by alkali development, thereby making it possible to leave a narrow pattern.

Examples of the acrylate monomer having a double bond equivalent of not more than 150 (C2) include 2-hydroxyethyl acrylate, 2-hydroxypropyl acrylate, methoxyethylene glycol acrylate, ethylene glycol diacrylate, triethylene glycol diacrylate, propylene glycol diacrylate, dipropylene glycol diacrylate, 1,4-butanediol diacrylate, 1,6-hexanediol diacrylate, nonanediol diacrylate, neopentyl glycol diacrylate, tris (2-acryloyloxyethyl) isocyanurate, trimethylolpropane triacrylate, ditrimethylolpropane tetraacrylate, pentaerythritol triacrylate, pentaerythritol tetraacrylate, dipentaerythritol pentaacrylate, dipentaerythritol hexaacrylate, tris-(2-acryloxyethyl) isocyanurate and glycerin triacrylate. Out of these, acrylate monomers having a hydroxyl group are preferred and pentaerythritol triacrylate can be advantageously used from the viewpoint of the solubility in a resist peeling liquid of the cured photosensitive resin layer.

The photosensitive resin composition of the present invention may comprise or may not comprise (C3) an acrylate monomer having a double bond equivalent of more than 150 to less than 250. The total content of the components (C1) and (C2) in the photosensitive resin composition of the present invention is preferably 80 to 100 mass %, more preferably 90 to 100 mass % based on the acrylate monomer (C).

In the present invention, the content of the benzophenone-based sensitizer (E) is preferably 0.20 to 0.40 mass %, more preferably 0.25 to 0.35 mass % based on the photosensitive resin composition. When the content of the benzophenone-based sensitizer (E) is lower than 0.20 mass %, photosensitivity lowers, thereby reducing productivity. When the content of the benzophenone-based sensitizer (E) is higher than 0.40 mass %, the quantity of light absorbed by the top of an exposed part becomes large, the cross-sectional shape of a resist pattern after alkali development becomes like a reverse trapezoid, and the resolution of a narrow resist space may deteriorate. The expression "based on the photosensitive resin composition" in the explanation of the contents of the above components (A), (B), (C) and (E) means "based on the total content of the components (A), (B), (C), (D) and (B)".

The photosensitive resin composition of the present invention may comprise components other than the above components (A) to (E) as required. The other components include solvent, thermal polymerization inhibitor, plasticizer, colorant (dye, pigment), photochromic agent, light discoloring agent, thermal coloring inhibitor, filler, defoaming agent, flame retardant, adhesion imparting agent, leveling agent, peeling accelerator, antioxidant, flavoring agent, thermal curing agent, water repellent and oil repellent. They may be each contained in an amount of 0.01 to 20 mass %. They may be used alone or in combination of two or more.

The photosensitive resin layer containing the photosensitive resin composition can be formed by directly applying a coating solution containing the photosensitive resin composition of the present invention to the substrate. The coating solution containing the photosensitive resin composition of the present invention may be applied to a carrier film to form the photosensitive resin layer containing the photosensitive resin composition so as to produce a DFR, and the photosensitive resin layer may be transferred to the substrate.

The carrier film is preferably a transparent film which transmits ultraviolet light. For example, a polypropylene, polyethylene, polyester or polyvinyl alcohol film may be used. When a polyethylene terephthalate film is used out of these, it is advantageous in terms of lamination aptitude, peeling aptitude, optical transparency and refractive index, inexpensive and not embrittled and has high solvent resistance and high tensile strength. Therefore, it is very easy to use. The thickness of the carrier film is preferably 1 to 100 μm.

To form the photosensitive resin layer on the substrate or the carrier film, a coating technique using a device such as a roll coater, comma coater, gravure coater, air knife, die coater or bar coater may be used. The thickness of the photosensitive resin layer is preferably 3 to 40 μm, more preferably 5 to 20 μm. When the thickness of the photosensitive resin layer is smaller than 3 μm, adhesion and alkali developability deteriorate, whereby the resist pattern may peel off after alkali development. When the thickness of the photosensitive resin layer is larger than 40 μm, light scattering occurs often, whereby resolution may deteriorate.

The photosensitive resin layer formed on the carrier film may be laminated with a protective film as required. The protective film is laminated on the photosensitive resin layer on the opposite side to the carrier film to prevent the oxygen inhibition and blocking of the photosensitive resin layer. It is preferred that adhesive force between the photosensitive resin layer and the carrier film should be greater than adhesive force between the photosensitive resin layer and the protective film. A protective film having small fisheyes is preferred. As the protective film, a polyethylene film or polypropylene film is used.

EXAMPLES

The following examples are provided for the purpose of further illustrating the present invention but are in no way to be taken as limiting.

Examples 1 to 16 and Comparative Examples 1 to 5

Components shown in Table 1 were mixed together to obtain a coating solution of a photosensitive resin composition. The unit of the amount of each component in Table 1 is "parts by mass". The obtained coating solution was applied to a polyethylene terephthalate (PET) film (carrier film, trade name: R310, thickness of 16 μm, Manufactured by Mitsubishi Chemical Corporation) and dried at 80° C. for 5 minutes to remove a solvent component so as to obtain a photosensitive resin layer (thickness of 15 μm) containing the photosensitive resin composition on one side of the PET film. A polyethylene film (protective film, trade name: GF1, thickness of 30 μm, manufactured by Tamapoly Co., Ltd.) was attached to the surface of the photosensitive resin layer to manufacture a DFR.

TABLE 1

| Component | | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 | Ex. 15 | Ex. 16 |
|---|---|---|---|---|---|---|---|---|---|---|---|---|---|---|---|---|---|---|
| Amount | (A) | (A-1) | 59 | 59 | 59 | 59 | 59 | | | | | | | | | | | |
| | | (A-2) | | | | | | 59 | 59 | 59 | 59 | 59 | | | | | | |
| | | (A-3) | | | | | | | | | | | 63 | 63 | 63 | 63 | 63 | 63 |
| | (B) | (B-1) | 1.0 | 0.5 | 1.5 | 1.0 | 1.0 | 1.0 | 1.0 | 1.0 | 1.0 | 1.0 | 1.0 | 1.0 | 1.0 | 1.0 | 0.7 | 1.2 |
| (C) | (C1) | (C1-1) | 20 | | | | 24 | | | | | | | | | | | |
| | | (C1-2) | | 20 | | | | | 20 | 20 | 20 | 20 | 17 | 17 | 15 | 18 | 17 | 17 |
| | | (C1-3) | | | | 16 | | | | | | | | | | | | |
| | | (C1-4) | | | 20 | | | | | | | | | | | | | |
| | | (C1-5) | | | | | | 21 | | | | | | | | | | |
| | (C2) | (C2-1) | | | | 24 | | 20 | | | | | | | | | | |
| | | (C2-2) | | 20 | | | 16 | | 20 | 20 | 20 | 20 | 18 | | 18 | 15 | 17 | 17 |
| | | (C2-3) | | | 20 | | | | | | | | | | | | | |
| | | (C2-4) | 20 | | | | | | | | | | | | | | | |
| | | (C2-5) | | | | | | | | | | | | 12 | | | | |
| | (D) | (D-1) | | | | | | 2 | | | | | | | | | | |
| | (E) | (E-1) | 0.3 | 0.3 | 0.3 | 0.3 | 0.3 | 0.3 | 0.2 | 0.4 | 0.1 | 0.5 | 0.2 | 0.2 | 0.3 | 0.3 | 0.3 | 0.3 |
| Colorant | Malachite green | | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |
| Solvent | Methyl ethyl ketone | | 70 | 70 | 70 | 70 | 70 | 70 | 70 | 70 | 70 | 70 | 70 | 70 | 70 | 70 | 70 | 70 |
| | Isopropyl alcohol | | 30 | 30 | 30 | 30 | 30 | 30 | 30 | 30 | 30 | 30 | 30 | 30 | 30 | 30 | 30 | 30 |
| Content 1 | | | 0 | 0 | 0 | 0 | 0 | 0 | 0 | 0 | 0 | 0 | 0 | 0 | 0 | 0 | 0 | 0 |
| Content 2 | | | 50 | 50 | 50 | 40 | 60 | 51 | 50 | 50 | 50 | 50 | 49 | 59 | 45 | 55 | 50 | 50 |
| Content 3 | | | 50 | 50 | 50 | 60 | 40 | 49 | 50 | 50 | 50 | 50 | 51 | 41 | 55 | 45 | 50 | 50 |
| Content 4 | | | 1.0 | 0.5 | 1.5 | 1.0 | 1.0 | 1.0 | 1.0 | 1.0 | 1.0 | 1.0 | 1.0 | 1.1 | 1.0 | 1.0 | 0.7 | 1.2 |
| Content 5 | | | 0.30 | 0.30 | 0.30 | 0.30 | 0.30 | 0.29 | 0.20 | 0.40 | 0.10 | 0.50 | 0.20 | 0.21 | 0.31 | 0.31 | 0.31 | 0.30 |

C. Ex.: Comparative Example

TABLE 2

| Component | | | C. Ex. 1 | C. Ex. 2 | C. Ex. 3 | C. Ex. 4 | C. Ex. 5 |
|---|---|---|---|---|---|---|---|
| Amount | (A) | (A-1) | 59 | 59 | 59 | 59 | 59 |
| | | (A-2) | | | | | |
| | (B) | (B-1) | 2.0 | 1.0 | 1.0 | 0.3 | 1.0 |
| | (C) (C1) | (C1-1) | | 13 | | | |
| | | (C1-2) | | | | | 19 |
| | | (C1-3) | | | 27 | | |
| | | (C1-4) | | | | 20 | |
| | | (C1-5) | 20 | | | | |
| | (C2) | (C2-1) | | 27 | | | |
| | | (C2-2) | | | 13 | | |
| | | (C2-3) | | | | 20 | 18 |
| | | (C2-4) | 20 | | | | |
| | (D) | (D-1) | | | | | 3 |
| | (E) | (E-1) | 0.3 | 0.3 | 0.3 | 0.3 | 0.3 |
| Colorant | | Malachite green | 0.1 | 0.1 | 0.1 | 0.1 | 0.1 |
| Solvent | | Methyl ethyl ketone | 70 | 70 | 70 | 70 | 70 |
| | | Isopropyl alchol | 30 | 30 | 30 | 30 | 30 |
| Content 1 | | | 0 | 0 | 0 | 0 | 8 |
| Content 2 | | | 50 | 33 | 68 | 50 | 51 |
| Content 3 | | | 50 | 68 | 33 | 50 | 49 |
| Content 4 | | | 2.0 | 1.0 | 1.0 | 0.3 | 1.0 |
| Content 5 | | | 0.30 | 0.30 | 0.30 | 0.30 | 0.30 |

C. Ex.: Comparative Example

Components in Table 1 and Table are as follows.

(A) Alkali-Soluble Resin (A-1): copolymer resin obtained by copolymerizing methyl methacrylate, n-butyl acrylate and methacrylic acid in a weight ratio of 58/15/27 (weight average molecular weight of 70,000)

(A-2): copolymer resin obtained by copolymerizing methyl methacrylate, n-butyl acrylate and methacrylic acid in a weight ratio of 55/20/25 (weight average molecular weight of 30,000)

(A-3) copolymer resin obtained by copolymerizing methyl methacrylate, n-butyl acrylate and methacrylic acid in a weight ratio of 64/15/21 (weight average molecular weight of 20,000)

(B) Photopolymerization Initiator (B-1): 2-(2'-chlorophenyl)-4,5-diphenyl imidazole dimer (C) Acrylate Monomer (C1) acrylate monomer having a double bond equivalent of not less than 250

(C1-1): polyethylene glycol #400 diacrylate (9 ethoxy groups, molecular weight of 508)

(C1-2): polyethylene glycol #600 diacrylate (14 ethoxy groups, molecular weight of 708)

(C1-3): polyethylene glycol #1000 diacrylate (23 ethoxy groups, molecular weight of 1108)

(C1-4): diacrylate of ethylene oxide adduct of bisphenol A (10 ethoxy groups)

(C1-5): ethoxylated pentaerythritol tetraacrylate (35 ethoxy groups)

(C2) acrylate monomer having a double bond Equivalent of not more than 150

(C2-1): triethylene glycol diacrylate (C2-2): pentaerythritol triacrylate (C2-3): trimethylolpropane triacrylate (C2-4): neopentyl glycol diacrylate (C2-5): 2-hydroxypropyl acrylate (D) Methacrylate Monomer (D-1): dimethacrylate of ethylene oxide adduct of bisphenol A (10 ethoxy groups)

(E) Benzophenone-Based Sensitizer (E-1): N,N'-tetraethyl-4,4'-diaminobenzophenone The contents 1 to 5 in Table 1 denote the following and the unit of each of the contents is [mass %].

Content 1: content of methacrylate monomer (D) based on acrylate monomer (C)

Content 2: content of acrylate monomer having a double bond equivalent of not less than 250 (C1) based on acrylate monomer (C)

Content 3: content of acrylate monomer having a double bond equivalent of not more than 150 (C2) based on acrylate monomer (C)

Content 4: content of photopolymerization initiator (B) based on photosensitive resin composition Content 5: content of benzophenone-based sensitizer (E) based on photosensitive resin composition <Evaluation of Etching>

The protective film was peeled off from the DFR and the photosensitive resin layers of Examples 1 to 16 and Comparative Examples 1 to 5 were each attached to a TiCu alloy substrate having a thickness of 30 μm. Then, the photosensitive resin layers were exposed with a super-high pressure mercury lamp through photomasks (line/space=30 μm/30 μm, 40 μm/40 μm, 50 μm/50 μm), respectively. After exposure, they were left at room temperature for 10 minutes, the PET film was removed, and alkali development was carried out by spraying the surface of the photosensitive resin layer with a 1 mass % sodium carbonate aqueous solution (30° C.) at a spray pressure of 0.1 MPa for 10 seconds to remove the photosensitive resin layer of unexposed parts. Thereafter, the photosensitive resin layers were washed with water at 20° C. and a spray pressure of 0.1 MPa for 30 seconds and dried. Subsequently, they were baked at 120° C. for 20 minutes.

In all of the photosensitive resin layers of Examples 1 to 16, 40 μm/40 μm and 50 μm/50 μm resist patterns could be resolved. In the photosensitive resin layers of Examples 1 to 8 and Examples 11 to 16, a 30 μm/30 μm resist pattern could also be resolved. In Example 9 in which the content of the benzophenone-based sensitizer (E) was lower than 0.20 mass % based on the photosensitive resin composition and Example 10 in which the content of the benzophenone-based sensitizer (E) was higher than 0.40 mass % based on the photosensitive resin composition, part of the 30 μm/30 μm resist pattern peeled off.

When the difference between the top width and the bottom with of each 50 μm line in each of the resist patterns on the photosensitive resin layers of Examples 1 to 16 was measured, in Example 3 and Example 6 in which the polyethylene glycol diacrylate having a double bond equivalent of not less than 250 was not contained as the component (C1), the bottom width was about 5 μm larger than the top width, in Example 4 in which the polyethylene glycol diacrylate having a double bond equivalent of not less than 250 was contained as the component (C1) and was polyethylene glycol #1000 diacrylate, the bottom width was about 3 μm larger than the top width, and in Example 1 and Example 5 in which the polyethylene glycol diacrylate having a double bond equivalent of not less than 250 was contained as the component (C1) and was polyethylene glycol #400 diacrylate, the top width was about 3 μm larger than the bottom width. In Example 2 and Examples 7 to 16 in which polyethylene glycol #600 diacrylate was contained as the component (C1), the bottom width was about 1 μm larger than the top width and the cross-sectional shape of each line was almost rectangular.

In Comparative Example 1 in which the content of the photopolymerization initiator (B) was higher than 1.5 mass % based on the photosensitive resin composition and Comparative Example 3 in which the content of the acrylate monomer having a double bond equivalent of not less than 250 (C1) was higher than 60 mass % and the content of the acrylate monomer having a double bond equivalent of not more than 150 (C2) was lower than 40 mass % based on the acrylate monomer (C), all the lines/spaces were destroyed and a resist pattern could not be obtained. In Comparative Example 4 in which the content of the photopolymerization initiator (1) was lower than 0.5 mass % based on the photosensitive resin composition, all the lines/spaces peeled off and the photosensitive resin layer did not remain.

In Comparative Example 2 in which the content of the acrylate monomer having a double bond equivalent of not less than 250 (C1) was lower than 40 mass % and the content of the acrylate monomer having a double bond equivalent of not more than 150 (C2) was higher than 60 mass % based on the acrylate monomer (C) and Comparative Example 5 in which the content of the methacrylate monomer (D) was higher than 5 mass % based on the acrylate monomer (C), a resist pattern could be resolved well.

In Examples 1 to 16 and Comparative Examples 2 and 5, a 60° C. ferric chloride solution was prepared to carry out etching by spraying at a pressure of 0.2 MPa for about 2 minutes. Thereafter, washing and drying were carried out swiftly to manufacture an etched substrate.

When each etched substrate was observed, in Examples 1 to 16, in part of a resist pattern in which side etching proceeded, no missing part was found. When the etchant infiltrated into a space between the substrate and the photosensitive resin layer, there would be a difference between the line width of the resist pattern and the line width of the substrate after etching. Therefore, when the infiltration amount of the etchant (bottom line width of resist pattern-top line width of TiCu alloy substrate) was observed, good etching results with an infiltration amount of not more than 5 μm and no rattling were obtained.

In Comparative Example 2, in part of a resist pattern in which side etching proceeded, several missing parts were found. The infiltration amount of the etchant was not less than 6 μm and etching could not be performed well as compared with Examples 1 to 16.

The resist was peeled off by immersing the etched substrate in a 3 mass % sodium hydroxide aqueous solution (40° C.). When the resist peeled pieces were observed after 1 hour of immersion, in all of Examples 1 to 16, the peeled pieces dissolved without entangling with the TiCu alloy substrate, thus obtaining good results. When the dissolution time of the resist peeled pieces was measured, in Example 1, Example 3, Example 4 and Example 6 in which the component (C2) was an acrylate monomer having a double bond equivalent of not more than 150 and containing no hydroxyl group, it was at least 30 minutes, in Example 12 in which the component (C2) was an acrylate monomer having a double bond equivalent of not more than 150 and containing a hydroxyl group, it was 20 to 25 minutes, and in Examples 2, Example 5, Examples 7 to 11 and Examples 13 to 16 in which the component (C2) was pentaerythritol triacrylate, the peeled pieces dissolved within 15 minutes. In Comparative Examples 2 and 5, the peeled pieces remained in such a manner that they entangled with the TiCu alloy substrate, thereby causing a peeling failure.

<Evaluation of Plating>

A substrate having a copper thickness of 2 μm was prepared by half etching a both-side copper clad laminated sheet (area of 340 mm×510 mm, copper foil thickness of 12 μm, substrate thickness of 0.1 mm, manufactured by Mitsubishi Gas Chemical Company Inc.). The protective film of a DFR was removed and the photosensitive rein layers of Examples 1 to 16 and Comparative Examples 1 to 5 were each attached to the copper foil surface of the substrate. Then, the photosensitive resin layers were exposed with a super-high pressure mercury lamp through photomasks (line/space=30 μm/30 μm, 40 μm/40 μm, 50 μm/50 μm), respectively. After exposure, they were left at room temperature for 10 minutes, the PET film was removed, and alkali development was carried out by spraying the surface of the photosensitive resin layer with a 1 mass % sodium carbonate aqueous solution (30° C.) at a spray pressure of 0.1 MPa for 10 seconds to remove the photosensitive resin layer of unexposed parts. Thereafter, the photosensitive resin layers were washed with water at 20° C. and a spray pressure of 0.1 MPa for 30 seconds and dried. Subsequently, they were baked at 120° C. for 20 minutes.

In Examples 1 to 16, 40 μm/40 μm and 50 μm/50 μm resist patterns could be resolved. In Examples 1 to 8 and Examples 11 to 16, 30 μm/30 μm resist patterns could also be resolved. In Example 9 in which the content of the benzophenone-based sensitizer (E) was lower than 0.20 mass % based on the photosensitive resin composition and Example 10 in which the content of the benzophenone-based sensitizer (E) was higher than 0.40 mass % based on the photosensitive resin composition, part of a 30 μm/30 μm resist pattern peeled off.

In Comparative Example 1 in which the content of the photopolymerization initiator (B) was higher than 1 mass % based on the photosensitive resin composition and Comparative Example 3 in which the content of the acrylate monomer having a double bond equivalent of not less than 250 (C1) was higher than 60 mass % and the content of the acrylate monomer having a double bond equivalent of not more than 150 (C2) was lower than 40 mass % based on the acrylate monomer (C), all the lines/spaces were destroyed and a resist pattern could not be obtained. In Comparative Example 4 in which the content of the photopolymerization initiator (B) was lower than 0.5 mass % based on the photosensitive resin composition, all the lines/spaces peeled off and the resist pattern did not remain.

In Comparative Example 2 in which the content of the acrylate monomer having a double bond equivalent of not less than 250 (C1) was lower than 40 mass % and the content of the acrylate monomer having a double bond equivalent, of not more than 150 (C2) was higher than 60 mass % based on the acrylate monomer (C) and Comparative Example 5 in which the content of the methacrylate monomer (D) was higher than 5 mass % based on the acrylate monomer (C), a resist pattern could be resolved well.

Then, in Examples 1 to 16 and Comparative Examples 2 and 5, electrolytic copper plating was carried out to form a copper plating layer having a thickness of 10 μm on the surface of copper foil exposed by alkali development. Subsequently, the resist was peeled off by immersing in a 3 mass % sodium hydroxide aqueous solution (40° C.) When the resist peeled pieces were observed after 1 hour of immersion, in Examples 1 to 16, the peeled pieces dissolved without remaining between copper plating layers, thus obtaining good results. When the dissolution time of the resist peeled pieces was measured, in Example 1, Example 3, Example 4 and Example 6 in which the component (C2) was an acrylate monomer having a double bond equivalent of not more than 150 and containing no hydroxyl group, it was at least 30 minutes, in Example 12 in which the component (C2) was an acrylate monomer having a double bond equivalent of not more than 150 and containing a hydroxyl group, it was 20 to 25 minutes, and in Example 2, Example 5, Examples 7 to 11 and Examples 13 to 16 in which the component (C2) was pentaerythritol triacrylate, the peeled pieces dissolved within 15 minutes. In Comparative Examples 2 and 5, the peeled pieces remained between copper plating layers, thereby causing a peeling failure.

Subsequently, flush etching was carried out by using a sulfuric acid-hydrogen peroxide-based etchant (40° C., spray pressure: 0.1 MPa) to form a copper pattern.

INDUSTRIAL FEASIBILITY

The photosensitive resin composition of the present invention can be used as a resist used for the etching and plating of a substrate in the manufacture of printed circuit boards, lead frames, metal masks, shadow masks, semiconductor packages, electrode members, electromagnetic shields and precision springs.

The invention claimed is:

1. A photosensitive resin composition which comprises (A) an alkali-soluble resin, (B) a photopolymerization initiator and (C) an acrylate monomer and may further comprise (D) a methacrylate monomer, wherein
the acrylate monomer (C) comprises (C1) an acrylate monomer having a double bond equivalent of not less than 250 and (C2) an acrylate monomer having a double bond equivalent of not more than 150; the content of the methacrylate monomer (D) is 0 to 5 mass %, the content of the acrylate monomer having a double bond equivalent of not less than 250 (C1) is 40 to 60 mass % and the content of the acrylate monomer having a double bond equivalent of not more than 150 (C2) is 40 to 60 mass % based on the acrylate monomer (C); and the content of the photopolymerization initiator (B) is 0.5 to 1.5 mass % based on the photosensitive resin composition, and
wherein the photosensitive resin composition further comprises (E) a benzophenone-based sensitizer, the content of the benzophenone-based sensitizer being 0.20 to 0.40 mass % based on the photosensitive resin composition.

2. The photosensitive resin composition according to claim 1, wherein the acrylate monomer having a double bond equivalent of not less than 250 (C1) is polyethylene glycol diacrylate and has a molecular weight of not less than 500.

3. The photosensitive resin composition according to claim 1, wherein the acrylate monomer having a double bond equivalent of not less than 250 (C1) is polyethylene glycol #600 diacrylate.

4. The photosensitive resin composition according to claim 1, wherein the acrylate monomer having a double bond equivalent of not more than 150 (C2) has a hydroxyl group.

5. The photosensitive resin composition according to claim 1, wherein the acrylate monomer having a double bond equivalent of not more than 150 (C2) is pentaerythritol triacrylate.

6. A method of etching a substrate, comprising the steps of:
forming a photosensitive resin layer containing the photosensitive resin composition of claim 1 on a substrate;
carrying out pattern exposure to cure exposed parts;
performing alkali development to remove the photosensitive resin layer of unexposed parts;
baking the resist pattern after alkali development to form a resist pattern containing the cured photosensitive resin layer; and
spraying the exposed substrate with an etchant to etch the substrate.

7. A method of plating a substrate, comprising the steps of:
forming a photosensitive resin layer containing the photosensitive resin composition of claim 1 on a substrate;
carrying out pattern exposure to cure exposed parts;
performing alkali development to remove the photosensitive resin layer of unexposed parts so as to form a resist pattern containing the cured photosensitive resin layer; and
plating the exposed substrate.

* * * * *